United States Patent [19]
Barclay et al.

[11] Patent Number: 6,042,997
[45] Date of Patent: Mar. 28, 2000

[54] COPOLYMERS AND PHOTORESIST COMPOSITIONS COMPRISING COPOLYMER RESIN BINDER COMPONENT

[75] Inventors: George G Barclay, Allston; Michael F. Cronin, Franklin, both of Mass.; Ronald A. Dellaguardia, Poughkeepsie, N.Y.; James W. Thackeray, Braintree, Mass.; Hiroshi Ito; Greg Breyta, both of San Jose, Calif.

[73] Assignees: IBM Corporation, Armonk, N.Y.; Shipley Company, L.L.C., Marlborough, Mass.

[21] Appl. No.: 09/012,352

[22] Filed: Jan. 23, 1998

Related U.S. Application Data

[63] Continuation of application No. 08/665,002, Jun. 11, 1996, Pat. No. 5,861,231.

[51] Int. Cl.[7] ................................. G03F 7/40; G03F 7/30
[52] U.S. Cl. .......................... 430/315; 430/326; 430/313; 430/317; 430/318
[58] Field of Search .................................. 430/326, 315, 430/313, 317, 318

[56] References Cited

U.S. PATENT DOCUMENTS

| | | | |
|---|---|---|---|
| 5,071,730 | 12/1991 | Allen et al. | 430/270.1 |
| 5,344,742 | 9/1994 | Sinta et al. | |
| 5,350,660 | 9/1994 | Urano et al. | 430/270.1 |
| 5,352,564 | 10/1994 | Takeda et al. | 430/270.1 |
| 5,443,690 | 8/1995 | Takechi et al. | 430/286.1 |
| 5,492,793 | 2/1996 | Breyta et al. | |
| 5,558,971 | 9/1996 | Urano et al. | 430/270.1 |
| 5,558,976 | 9/1996 | Urano et al. | 430/326 |
| 5,605,845 | 2/1997 | Young | |
| 5,679,495 | 10/1997 | Yamachika et al. | |
| 5,786,131 | 7/1998 | Allen et al. | 430/326 X |
| 5,866,304 | 2/1999 | Nakano et al. | 430/326 X |

FOREIGN PATENT DOCUMENTS

| | | |
|---|---|---|
| 0 440 374 A2 | 8/1991 | European Pat. Off. |
| 0 605 089 A2 | 7/1994 | European Pat. Off. |
| 0 701 171 A1 | 3/1996 | European Pat. Off. |
| 7-209868 | 8/1995 | Japan |
| 7-261377 | 10/1995 | Japan |

OTHER PUBLICATIONS

Ito et al., *J. Photopolymer Sci. Technol.*, 7:433 (1994).
JP 07 003 116 A (Nippon Oils & Fats Co.) Derwent Abstract Only.
An 95–314127, Abstract of JP 07–209,868, Derwent Information, Ltd.
Yamachika et al., 07–209868, Patent Abstracts of Japan; English Abstract of Japanese 07–209868, published Aug. 11, 1995.
Kobayashi et al., CA 124:101869, Chemical Abstracts of Japanese Document 7–261377 dated Oct. 13, 1995; AN 95–386,399, Abstract of JP 07–261377 dated Oct. 13, 1995.
Yamachika et al., CA 123:354655, Chemical Abstracts of Japanese Document 07–209868 dated Oct. 7, 1994.; RN 170636–47–2, Registry on line STN Database Service ACS, 1997.
English translation of Yamachika et al. (JP 07–209,868) translated by Diplomatic Language Services, Inc.
English translation of Kobayashi et al. (JP 07–261377) translated by Diplomatic Language Services, Inc.

*Primary Examiner*—Cynthia Hamilton
*Attorney, Agent, or Firm*—Darryl P. Frickey; S. Matthew Cairns; Peter F. Corless

[57] ABSTRACT

The present invention provides novel copolymers and photoresist compositions that contain such copolymers as a resin binder component. Preferred copolymers include three distinct repeating units: 1) units that contain acid-labile groups; 2) units that are free of both reactive and hydroxy moieties; and 3) units that contribute to aqueous developability of a photoresist containing the copolymer as a resin binder. Photoresists of the invention exhibit surprising lithographic improvements including substantially enhanced plasma etch resistance and isolated line performance as well as good dissolution rate control.

20 Claims, No Drawings

COPOLYMERS AND PHOTORESIST COMPOSITIONS COMPRISING COPOLYMER RESIN BINDER COMPONENT

This is a continuation of application Ser. No. 08/665,002, filed Jun. 11, 1996, now U.S. Pat. No. 5,861,231.

BACKGROUND OF THE INVENTION

1. Field of the Invention

The present invention relates to new copolymers and use of such copolymer as a resin binder component for photoresist compositions, particularly chemically-amplified positive-acting resists.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

While currently available photoresists are suitable for many applications, current resists also can exhibit significant shortcomings, particularly in high performance applications such as formation of highly resolved sub-micron and sub-half micron features.

For example, problems can arise upon etching a bared substrate surface defined by a developed resist relief image. In particular, to etch aluminum, silicon oxide and other substrates rather stringent conditions are often employed. Chlorine and fluorine-based gas etchants are frequently used and extensive localized heating often occurs during the etching sequence. As a consequence, the patterned photoresist coating on the substrate can experience shrinkage or other degradation. Such degradation can reduce resolution of the feature etched into the substrate and even render the substrate unusable for its intended purpose.

Problems also can arise with use of positive-acting chemically amplified resists. These resists utilize a deprotecting or cleavage reaction of a resin binder component to provide solubility differentials between exposed and unexposed areas. That deprotection reaction can result in cleavage of a substantial mass of the resist which in turn can cause significant shrinkage of the resist coating layer areas exposed to activating radiation. Such shrinkage can compromise resolution of the image patterned in the photoresist coating layer. See, for example, U.S. Pat. Nos. 4,968,581; 4,883,740; 4,810,613 and 4,491,628 for a discussion of resist resin binders that contain acid labile groups that undergo deprotection or cleavage reactions in the presence of photogenerated acid.

Another persistent shortcoming of current resists is poor resolution of "isolated" resist lines or other features, particularly when using a positive resist. A developed resist line or other feature is generally considered "isolated" if it is spaced from the closest adjacent resist feature a distance equal to two or more times the line width. Thus, e.g., if a line is printed at a 0.25 μm width, that line would be considered isolated (rather than dense) if the next adjacent resist feature was spaced at least about 0.50 microns from the line. Common resolution problems with isolated lines include rounded tops and undercutting.

It thus would be desirable to have new photoresist compositions, particularly resist compositions that exhibit enhanced stability or resistance to etching environments. It would be further desirable to have new chemically-amplified positive photoresist compositions that did not exhibit significant shrinkage during exposure and other processing steps. It also would be desirable to have new positive photoresist compositions that form highly resolved isolated lines.

SUMMARY OF THE INVENTION

The present invention provides novel copolymers and photoresist compositions that comprise a photoactive component and use of such copolymers as a resin binder component. The copolymers of the invention in general comprise at least one repeating unit that is free of hydroxy groups as well as reactive or volatile groups that would react under typical lithographic processing steps, e.g. in the presence of acid and/or thermally under typical lithographic processing such as pre-exposure and post-exposure bake temperatures (generally less than about 170° C. or 160° C).

Preferred copolymers include three distinct repeating units: 1) units that contain acid-labile groups such as acrylate groups; 2) units that are free of both reactive and hydroxy moieties, and preferably have a high carbon content; and 3) units that contribute to aqueous developability of a photoresist containing the copolymer as a resin binder, e.g. groups that contain hydroxy or carboxy groups such as a phenolic group.

It has been surprisingly found that copolymers of the invention used as photoresist resin binder components exhibit substantially improved resistance to aggressive etching environments such as chlorine or fluorine-based etchants. See, for instance, the results of Example 9 which follows.

Additionally, it has been most unexpectedly found that resists of the invention exhibit improved isolated line performance, i.e. resists of the invention form isolated relief features of improved resolution, including isolated lines having substantially square profiles without undercutting. Indeed, photoresist compositions comprising copolymers of the invention as a resin binder component provide highly resolved patterned images of sub-micron and sub-half micron dimensions, including highly resolved isolated lines having a width of less than about 0.40 microns, or even about 0.25 microns or less.

Still further, resins of the invention exhibit good dissolution rates that enable high resolution resist images. Resists that have too high of a dissolution rate can exhibit relatively decreased resolution, particularly when printing micron or sub-micron features.

It has been further found that polymers of the invention used as photoresist resin binder components exhibit substantially decreased shrinkage relative to comparable resists that comprise a resin binder that contains a polymer consisting of only units of phenolic groups and acid labile groups. See the results of Example 10 which follows.

The invention also provides methods for forming relief images, including methods for forming a highly resolved relief image such as a pattern of lines where each line has essentially vertical sidewalls and a line width of about 0.40 microns or less, or even about 0.25 microns or less. The invention further provides articles of manufacture comprising substrates such as a microelectronic wafer or a liquid crystal display or other flat panel display substrate having coated thereon the photoresists and relief images of the invention. Other aspects of the invention are disclosed infra.

DETAILED DESCRIPTION OF THE INVENTION

Preferred polymers of the invention include at least three distinct repeating units of 1) units that contain acid-labile groups; 2) units that are free of reactive groups as well as hydroxy groups; and 3) aromatic or other units that contribute to aqueous developability of a photoresist containing the copolymer as a resin binder. The polymers also may include other groups if desired. References herein to copolymer units 2) that do not contain "reactive groups" mean units that will not react with acid or thermally (generally less than about 170° C.) under typical lithographic processing (pre-exposure, exposure, post-exposure bake and development steps) of a photoresist containing the copolymer. Thus, e.g., units 2) could be a phenyl group with one or more non-volatile ring substituents such as halogen or alkoxy.

Copolymer units 1) include acid labile groups that will undergo photoacid induced cleavage upon exposure of a coating layer of a photoresist containing the polymer to provide solubility differentials between exposed and unexposed coating layer regions. The acid labile groups are preferably pendant to the polymer backbone. Acrylate groups are generally preferred and can be formed by free radical or other condensation of monomers of one or more substituted or unsubstituted alkyl acrylates such as t-butylacrylate. The pendant substituted ester moiety of the condensed acrylate unit, i.e. R—O—C(=O)—, serves as the pendant acid labile groups. A wide variety of acrylate units may be employed including those having an ester group (group R above) that is a non-cyclic or cyclic alkyl having 1 to about 14 carbon atoms, more typically 1 to about 8 carbons. Also suitable will be such alkyl ester groups that have one or more substituents such as halogen, particularly F, Cl or Br, $C_{1-6}$ alkoxy, aryl such as phenyl, etc. Exemplary compounds that may be condensed to provide the acrylate units of the polymers of the invention include methylacrylate, ethylacrylate, methylmethacrylate, ethyl methacrylate, butylacrylate including t-butylacrylate, butylmethacrylate including t-butylmethacrylate, etc. Such monomers are commercially available or can be readily prepared by known procedures.

A variety of other groups also will be suitable acid labile moieties of units 1), including groups discussed in the above-mentioned patents. In particular, acetate groups will be suitable, including groups pendant to the polymer backbone of the formula $R^3O(C=O)R^2R^1C$— where $R^1$ and $R^2$ are each independently selected from the group of hydrogen, substituted or unsubstituted $C_{1-10}$ alkyl or an electron-withdrawing group such as halogen; and $R^3$ is substituted or unsubstituted $C_{1-14}$ alkyl, substituted or unsubstituted aryl such as phenyl or substituted or unsubstituted aryalkyl such as benzyl. The substituents of substituted groups can be, e.g., halogen. $C_{1-6}$ alkyl, $C_{1-6}$ alkoxy, phenyl or other aryl, etc. Such acetate groups may be provided as described above for acrylate groups, i.e., by free radical or other condensation of monomers of one or more substituted or unsubstituted vinyl acetates such as allyl acetate and the like.

Copolymers of the invention also include units 2) that are free of reactive and hydroxyl groups. Preferred units 2) also have a high carbon content, and preferably at least about 75 percent of the unit's total mass is carbon, more preferably at least about 80 or even at least 90 percent of the unit's total mass is carbon. Specifically preferred groups include substituted and unsubstituted aryl groups, e.g. groups having about 6 to 18 aromatic carbons such as groups provided by condensation of substituted or unsubstituted styrene, naphthylene, acenaphthylene, etc. as well as substituted and unsubstituted vinyl alicyclic groups including those having 5 to about 12 carbon atoms such as substituted or unsubstituted vinyl norbornyl, vinyl adamantyl or vinyl cyclohexane. Non-cyclic substituted and unsubstituted alkyl groups also may be employed, e.g. having 1 to about 12 carbon atoms, but are generally less preferred than aryl or alicyclic groups. Suitable substituents of substituted or unsubstituted groups include e.g. $C_{1-8}$ alkoxy, particularly methoxy, ethoxy and propoxy; cyano; halogen (F, Cl, Br or I); alkynyl having 2 to about 10 carbon atoms; alkylthio having 1 to about 10 carbon atoms; and the like.

Copolymers of the invention also contain units 3) that contribute to aqueous developability of a photoresist containing the polymer as a resin binder. Aromatic groups such as substituted and unsubstituted phenyl and the like are generally preferred. For example, preferred groups contain hydroxy or carboxy groups, particularly hydroxy. Vinyl aromatic monomers substituted with such groups are generally preferred, e.g. a substituted or unsubstituted hydroxystyrene. Non-aromatic monomers also may be employed, e.g. vinyl cyclohexanol. Also, to facilitate polymer synthesis, a monomer may be reacted with a hydroxy or other aqueous-solubilizing group in "masked" form. For example, vinylphenylacetate may be employed as a "masked" form of hydroxystyrene. Other hydroxy masking or protecting groups also will be suitable such as an alkylsilyl groups (to form silylethers with the hydroxy moiety), e.g. $(CH_3)_3Si$—, $(CH_3)_2(butyl)Si$—, $((CH_3)_3C)_3Si$—, etc.; other alkyl esters, e.g. $CH_3CH_2C(=O)$—, etc. After reaction completion, the masking groups may be removed under basic conditions. For example, the formed polymer may be heated in the presence of a base such as $NH_4OH$ or $NH_4OAc$. See the examples which follow for exemplary conditions.

A particularly preferred copolymer of the invention corresponds to the following Formula I:

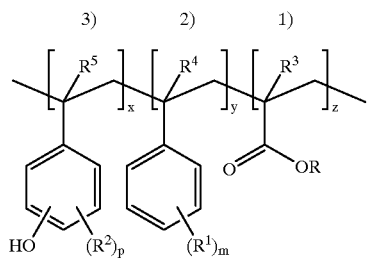

wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.

$R^1$ groups of units 2) of Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkynyl preferably having 2 to about 8 carbons, substituted or unsubstituted alkylthio preferably having 1 to about 8 carbons, cyano, nitro, etc.; and m is an integer of from 0 (where the phenyl ring is fully hydrogen-substituted) to 5, and preferably is 0, 1 or 2. Also, two $R^1$ groups on adjacent carbons may be taken together to form (with ring carbons to which they are attached) one, two or more fused aromatic or alicyclic rings having from 4 to about 8 ring members per ring. For example, two $R^1$ groups can be taken together to form (together with the depicted phenyl) a naphthyl or acenaphthyl ring. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.

$R^2$ groups of units 3) of Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted sulfonyl preferably having 1 to about to about 8 carbon atoms such as mesyl ($CH_3SO_2O$—), substituted or unsubstituted alkyl esters such as those represented by RCOO— where R is preferably an alkyl group preferably having 1 to about 10 carbon atoms, substituted or unsubstituted alkynyl preferably having 2 to about 8 carbons, substituted or unsubstituted alkylthio preferably having 1 to about 8 carbons, cyano, nitro, etc.; and p is an integer of from 0 (where the phenyl ring has a single hydroxy substituent) to 4, and preferably is 0, 1 or 2. Also, two $R^2$ groups on adjacent carbons may be taken together to form (with ring carbons to which they are attached) one, two or more fused aromatic or alicyclic rings having from 4 to about 8 ring members per ring. For example, two $R^2$ groups can be taken together to form (together with the phenol depicted in Formula I) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in Formula I above, the hydroxyl group of units 3) may be either at the ortho, meta or para positions throughout the copolymer. Para or meta substitution is generally preferred.

Each $R^3$, $R^4$ and $R^5$ substituent independently may be hydrogen or substituted or unsubstituted alkyl preferably having 1 to about 8 carbon atoms, more typically 1 to about 6 carbons, or more preferably 1 to about 3 carbons.

The above-mentioned substituted groups (i.e. substituted groups R and $R^1$ through $R^5$) may be substituted at one or more available positions by one or more suitable groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; alkanoyl such as a $C_{1-6}$ alkanoyl of acyl and the like; etc. Typically a substituted moiety is substituted at one, two or three available positions.

In the above Formula I, x, y and z are the mole fractions or percents of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.

Preferred copolymers include those where the only polymer units correspond to the general structures of units 1), 2) and 3) above and the sum of the mole percents x, y and z equals one hundred. However, preferred polymers also may comprise additional units wherein the sum of x, y and z would be less than one hundred, although preferably those units 1), 2) and 3) would still constitute a major portion of the copolymer, e.g. where the sum of x, y and z would be at least about 50 percent (i.e. at least 50 molar percent of the polymer consists of units 1), 2) and 3)), more preferably the sum of x, y and z is at least 70 percent, and still more preferably the sum of x, y and z is at least 80 or 90 percent.

A particularly preferred copolymer of the invention has the structure of the following Formula II:

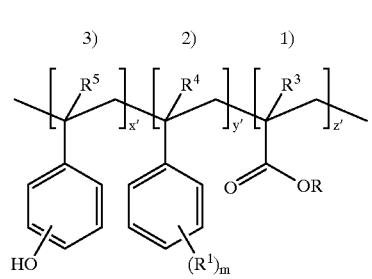

wherein x' is the mole fraction of units 3) and is suitably from about 20 to 90 percent, more preferably about 50 to 90 percent; y' is the mole fraction of units 2) and is suitably from about 2 to 60 percent, more preferably from about 5 to 40; and z' is the mole fraction of units 3) and is suitably from about 2 to 60 percent, more preferably about 5 to 40; and R, $R^1$, $R^3$, $R^4$, $R^5$ and m are the same as defined above for Formula I, and preferably units 3) are para-substituted by hydroxy. Preferably, the sum of x', y' and z' is about 90 percent or greater, more preferably one hundred percent.

Polymers of the invention can be prepared by free radical polymerization, e.g. by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See Examples 1 and 2 which follow for exemplary reactions conditions. Suitable reaction temperatures for any particular system can be readily determined empirically by those skilled in the art based on the present disclosure.

A reaction solvent may be employed if desired. Suitable solvents include alcohols such as propanols and butanols and aromatic solvents such as benzene, chlorobenzene, toluene and xylene. Dimethylsulfoxide and dimethylformamide are also suitable. The polymerization reaction also may be run neat.

A variety of free radical initiators may be employed to prepare the copolymers of the invention. For example, azo compounds may be employed such as azo-bis-2,2'-isobutyronitrile (AIBN) and 1,1'-azobis (cyclohexanecarbonitrile). Peroxides, peresters, peracids and persulfates also can be employed.

Preferably the copolymer of the invention will have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, the copolymers of the invention are highly useful as the resin binder component in photoresist compositions, particularly chemically-amplified positive resists. Photoresists of the invention in general comprise a photoactive component and a resin binder component that comprises the above-described copolymer.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Generally, sulfonate compounds are preferred PAGs, particularly sulfonate salts. Two specifically preferred agents are the following PAGS 1 and 2:

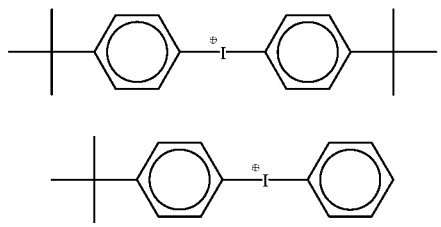

1

2

Such sulfonate compounds can be prepared as disclosed in Example 8 which follows, which details the synthesis of above PAG 1. Sulfonate PAG 2 above can be prepared by the same procedures of Example 8 which follows, except approximately molar equivalents of t-butyl benzene and benzene would be reacted together in the first step with acetic anhydride and $KIO_3$.

Other suitable sulfonate PAGS including sulfonated esters and sulfonyloxy ketones. See J. of *Photopolymer Science and Technology,* 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No 5,344,742 to Sinta et al.

Onium salts are also generally preferred acid generators of compositions of the invention. Onium salts that weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generators include the family of nitrobenzyl esters, and the s-triazine derivatives. Suitable s-triazine acid generators are disclosed, for example, in U.S. Pat. No. 4,189,323.

Halogenated non-ionic, photoacid generating compounds also may be suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1 -bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p -chlorophenyl] -2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators preferred for deep U.V. exposure include 1,1-bis(p-chlorophenyl)-2,2,2-trichloroethane (DDT); 1,1-bis(p-methoxyphenol)-2,2,2-trichloroethane; 1,1-bis (chlorophenyl)-2,2,2 trichloroethanol; tris(1,2,3-methanesulfonyl)benzene; and tris(trichloromethyl)triazine.

A preferred optional component of resist compositions of the invention is a dye compound. Preferred dyes can enhance resolution of the patterned resist image, typically by reducing reflections and the effects thereof (e.g. notching) of the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. A curcumin dye also may be used for some applications. Rather than a separate composition component, such dyes also can be incorporated directly into the copolymer, e.g. where two adjacent $R^1$ moieties of units 2) above together form a fused ring to provide an acenaphthyl moiety or the like. In addition to reducing reflections in deep U.V. exposures, use of a dye may expand the spectral response of the compositions of invention including beyond 248 nm or other deep UV wavelengths, such as to 365 nm or 436 nm exposure wavelengths.

Another preferred optional additive is an added base, particularly tetrabutylammonium hydroxide (TBAH), or the lactate salt of TBAH, which can enhance resolution of a developed resist relief image. The added base is suitably used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether, propylene glycol monomethyl ether; a Cellosolve ester such as methyl ethyl ketone; and 3-ethoxy ethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See Example 8 which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 mJ/cm$^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 150 to 300 or 450 nm. A particularly preferred exposure wavelength is about 248 nM.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream. As discussed above, the compositions of the invention are highly resistant to such etchants thereby enabling manufacture of highly resolved features, including lines with submicron widths. See also the results of Example 9 which follows. After such processing, resist may be removed from the processed substrate using known stripping procedures.

All documents mentioned herein are fully incorporated herein by reference.

The following non-limiting examples are illustrative of the invention.

EXAMPLES 1–7

Preparation of copolymers of the invention.

Example 1

Synthesis using acetoxystyrene ("masked" monomer)

4-Acetoxystyrene (115.7 g. 0.714 mol), styrene (21.1 g, 0.204 mol) and t-butylacrylate (12.8 g, 0.102 mol) were dissolved in 375 ml of isopropyl alcohol. The reaction solution was then deoxygenated by gently bubbling a stream of $N_2$ through the stirring solution for 20 minutes, and then placing it under a blanket of $N_2$. The polymerization solution was then brought to a gentle reflux. Azo-bis-2,2'-isobutyronitrile (AIBN) 6.69 g (0.273 mol) dissolved in 20 ml of acetonitrile, was then added to the gently refluxing mixture over 5 minutes. The polymerization was then refluxed with stirring for 24 hours.

Upon completion of the polymerization the 4-acetoxystyrene repeat unit was quantitatively converted to 4-hydroxystyrene by deacetylation with base. To the refluxing polymerization solution ammonium acetate (110.1 g, 0.499 mol) dissolved in 26 ml of water was added over 15 minutes. After addition, the reaction mixture was gently refluxed for 18 hours, during which time the polymer went into solution. The polymer is then filtered, washed well with water, and slurried in water (2000 ml) for 2 hours. Finally the terpolymer was filtered, washed well with water and dried in a vacuum oven at 50° C. overnight. The composition and other characteristics of the terpolymer are set forth in Table 1 below.

Example 2

Synthesis using hydroxystyrene

4-Hydroxystyrene (17.50 g, 0.146 mol), styrene (7.6 g, 0.073 mol) and t-butylacrylate (9.3 g, 0.073 mol) were dissolved in 85 ml of isopropyl alcohol. The reaction solution was then deoxygenated by gently bubbling a stream of $N_2$ through the stirring solution for 20 minutes, and then placing it under a blanket of $N_2$. The polymerization solution was then brought to a gentle reflux. Azo-bis-2,2'-isobutyronitrile (AIBN) (0.48 g, 0.003 mol) dissolved in 5 ml of acetonitrile, was then added to the gently refluxing mixture over 5 minutes. The polymerization was then refluxed with stirring for 24 hours. Upon completion of the polymerization the polymer was isolated by precipitation into water (1000 ml), filtered, washed well with water, and dried in a vacuum oven at 50° C. overnight. The composition and other characteristics of the terpolymer are set forth in Table 1 below.

Examples 3–7 and Comparative Example

By similar procedures as disclosed in Examples 1–2, five additional terpolymers of the invention (copolymers of Examples 3–7 respectively) were prepared. A comparative example copolymer lacking any units 2) was also prepared. Composition and other characteristics of these polymers are set forth in Table 1 below (Comp. Ex. refers to the comparative example material). Weight loss values were determined using thermal gravimetric analysis over a temperature range. Lower weight loss values indicate decreased shrinkage of a photoresist containing the copolymer as a resin binder component. In Table 1 below, references to x, y and z are the mole percent composition of the copolymer of the units of 4-phenol, phenyl and t-butylacrylate respectively as shown by the following formula:

| Component | Amount |
|---|---|
| Resin binder | |
| Terpolymer (70% hydrostyrene, 10% styrene, 20% tert-butylacrylate; copolymer of Example 1 above) | 4.604 |
| Photoactive Component | |
| Di-t-butylphenyl iodonium camphor sulfonate | 0.186 |
| Base additive | |
| Tetrabutyl ammonium lactate | 0.014 |
| Surfactant | |
| Polymethoxy silane sold as Silwet L-4604 (Union Carbide) | 0.025 |
| Solvent | |
| Ethyl lactate | 25.197 |

Resists 2 through 6 were prepared in the same manner as Resist 1 with the same components in essentially the same amounts but with substitution of the terpolymer of Examples 2 through 6 as the resin binder for Resists 2 through 6 respectively (i.e. Resist 2 contained as a resin binder the terpolymer of Example 2, Resist 3 contained the terpolymer of Example 3, and so on).

The resists were spin coated onto HMDS vapor primed 4 inch bare silicon wafers and softbaked via a vacuum hotplate at 140° C. for 60 seconds to obtain a 30 nominal thickness of 8300 Å. The resists were exposed using a GCA XLS DUV exposure unit which has a numerical aperture of 0.53. A

TABLE 1

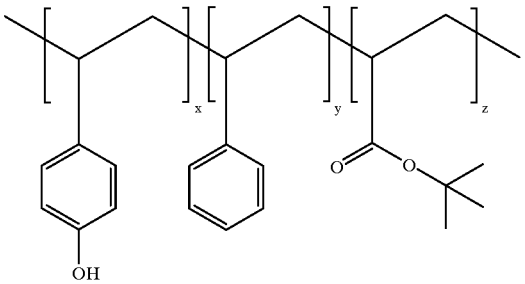

| Ex. No. | x | y | z | Mn | Mw/Mn | $T_g$ (° C.) | $T_d$ (° C.) | % Wt loss |
|---|---|---|---|---|---|---|---|---|
| 1. | 70(71)[a] | 10(11) | 20(18) | 4953 | 1.65 | 151 | 217 | 9.9 |
| 2. | 75(73) | 10(12) | 15(15) | 5127 | 1.63 | 154 | 210 | 9.1 |
| 3. | 75(75) | 15(15) | 10(9) | 5271 | 1.64 | 156 | 218 | 7.0 |
| 4. | 65(65) | 15(17) | 20(18) | 5260 | 1.66 | 144 | 225 | 11.4 |
| 5. | 70(72) | 20(20) | 10(8) | 5125 | 1.64 | 148 | 211 | 6.5 |
| 6. | 65(66) | 20(21) | 15(13) | 5013 | 1.65 | 146 | 226 | 9.9 |
| 7. | 50(46) | 25(26) | 25(28) | 22696 | 1.96 | 134 | 225 | 13.0 |
| Comp. Ex. | 65(69) | 0 | 35(31) | 5913 | 2.04 | 152 | 220 | 16.8 |

Example 8

Preparation and lithographic processing of photoresists of the invention

Six photoresist compositions ("Resists 1 through 6") were prepared. Resists 1 through 6 each contained as a resin binder component the copolymers of Examples 1 through 6 respectively. Resist 1 was the following prepared by admixing the specified components with amounts expressed as parts by weight based on total weight of the composition.

10×10 exposure matrix was used to determine the clearing energy (Eo) of the resists films. The exposed films were post-exposure baked via vacuum hotplate at 140° C. for 90 seconds. Resist development was performed using track development for 45 seconds with a double spray puddle program. The developer was MF CD-26 (0.26 N) developer.

Resist images were generated using 1.6 times the clearing dose as the starting point of a 13 point exposure matrix. SEM micrographs indicated that the resists yielded excellent isolated line performance at 0.25 μm feature sizes, and showed significant improvement in the image profile and in the focus latitude versus a comparable resist system that contained a resin binder that contained a copolymer consisting only of polyhydroxystyrene and tributylacrylate units.

The PAG of the resists can be prepared as follows. A 2 L 3 neck round bottom flask was charged with potassium iodate (214.00 g, 1.00 mol), t-butylbenzene (268.44 g, 2.00 mol) and acetic anhydride (408.36 g, 4.00 mol). The flask was fitted with an efficient overhead paddle stirrer, a thermometer and a pressure equalizing dropping funnel fitted with a $N_2$ bubbler. The reaction mixture was cooled to 10° C. in a ice-water bath and concentrated sulfuric acid (215.78 g, 2.20 mol) added dropwise via the addition funnel. The addition was carried out at such a rate as to maintain the reaction temperature around 25° C. and required 2 hours. As the addition proceeded the starting white suspension became orange-yellow in color. Once the addition was over, the reaction mixture was stirred at room temperature (20° C.) for an additional 22 hours. The reaction mixture was cooled to 5–10° C. and water (600 ml) was added dropwise over a period of 30 minutes, maintaining the temperature below 30° C. (Note the first @75 ml should be added at a particular slow rate as to control the initial exotherm, thereafter the rest of the water may be added at a faster rate). This cloudy mixture was washed with hexane (3×100 ml) (to remove unreacted t-butylbenzene and some 4-t-butyliodobenzene byproduct) in a 2 L separating funnel and the aqueous solution of diaryliodonium hydrogensulfate transferred to a 3 L reaction vessel. The solution was cooled to 5–10° C., (+/−)-10-camphorsulfonic acid (232.30 g, 1.00 mol) was added in one portion with stirring and the solution was then neutralized with ammonium hydroxide (620 ml, 9.20 mol). The amount of base used was the theoretical amount required to neutralize all acidic species in the pot, assuming quantitative reaction. The addition of the base is carried out at such a rate as to keep the temperature below 25° C. and takes about 1 hour. As the addition nears completion and the pH of the reaction mixture approaches 7, the crude diaryliodonium camphorsulfonate precipitated as a tan solid. This suspension was allowed to stir at room temperature for 3 hours and the material isolated as follows: The tan solid was collected by suction filtration and while still moist taken up in dichloromethane (12 L) and washed with dilute ammonium hydroxide (2.5 wt %, 5 ml 14.8 N $NH_4OH$+195 ml $H_2O$) until the washings are in the pH 7–8 range (1×200 ml) and then water (2×200 ml) to restore the pH to around 7. After drying ($MgSO_4$), the dichloromethane was removed under reduced pressure and the residue further dried in vacuo at 50° C. for 16 hours to give the crude product as a tan solid (390.56 g). The resulting tan solid was then purified by recrystallization in the following manner. The tan solid was dissolved in the minimum amount of refluxing isopropanol (@ 375 g PAG in @ 1150 ml IPA) in a 2 L round bottom flask to give a homogeneous dark red solution. The hot solution was transferred to a 2 L conical flask and allowed to cool. While this solution was still warm, hexane (500 ml) was added and crystals formed soon after. The crystallizing mixture was allowed to cool to room temperature and stored for 4 hours. The crystallizing solution was cooled to @ 5° C. in an ice-water bath for 1.5 hours and then the solid was collected by suction filtration and washed until white with very cold isopropanol-hexane (1:3, 2×200 ml, prepared by cooling the solvent mixture in a dry ice-acetone bath before use). The white solid was dried under aspirator vacuum for 1 hour until the PAG (di-(4-t-butylphenyl) iodonium (+/−)-10-camphor sulfonate) was isolated as a free flowing white powder. At this stage about 285 g of PAG is obtained. A second recrystallization can be performed in a similar manner.

A lactate salt of TBAH (tetra-n-butylammoniumd/l-lactate salt; $[(CH_3CH_2CH_2CH_2)_4NO(CO)CH(OH)CH_3])$ can be prepared as follows. To a solution of tetra-n-butylammonium bromide (16.12 g, 50.0 mmol) in water (50 ml) was added a gray colored suspension of silver lactate (9.85 g, 50.0 mmol) in water (100 ml). As the addition proceeded a grayish white solid, presumably silver bromide, precipitated from solution. The resulting suspension was stirred at room temperature for 15 hours, the solid was filtered off and washed with water (3×50 ml). The combined filtrate and washings were concentrated under reduced pressure and the residual oil dried in vacuo at 50° C. for 24 hours to give the title compound as a colorless oil (16.62 g, 99%). Upon standing at room temperature, this oil later formed a waxy semi-solid.

Example 9

Etch resistance of photoresists of the invention

Relief images of Resists 1 through 6 were exposed to an aggressive etching environment, specifically etching of the wafer surface bard upon development with a $CF_4/CHF_3$ plasma etchant for 180 seconds. Each of Resists 1 through 6 showed less than 7,500 angstroms of resist removed during the etching process. Resist 5 showed less than 7,300 angstroms of resist removed and Resist 6 showed about 7,300 resist removed during the etching process. Two commercially available resist formulations that contained a resin binder that contained a copolymer consisting only of polyhydroxystyrene and tributylacrylate units all showed greater than 7,700 angstroms of resist removed during the etching process. One of these comparison resists showed greater than 7,850 angstroms of resist removed and another of the comparison resists showed greater than 8,000 angstroms removed during the etching process.

Similar differences in etch resistance between the resists of the invention and comparable resists that contained a copolymer consisting only of polyhydroxystyrene and tributylacrylate units were seen in a 30 second $CF_4$ etch and where the resists were coated over an antireflective layer.

Example 10

Reduced shrinkage of photoresists of the invention

Six photoresist compositions were prepared ("Resists 1 through 6") consisting of ethyl lactate solutions that each contained the same quantity of a PAG of di-t-butylphenyl iodonium camphor sulfonate and a resin binder of the following copolymer: Resist 1: a terpolymer of 65 mole % 4-hydroxystyrene units, 15 mole % styrene units, and 20 mole percent of t-butylacrylate units;

Resist 2: 65 mole % 4-hydroxystyrene units, 20 mole % styrene units, and 15 mole percent of t-butylacrylate units, Resist 3: 70 mole % 4-hydroxystyrene units, 10 mole % styrene units, and 20 mole percent of t-butylacrylate units;

Resist 4: 70 mole % 4-hydroxystyrene units, 20 mole % styrene units, and 10 mole percent of t-butylacrylate units;

Resist 5: 75 mole % 4-hydroxystyrene units, 10 mole % styrene units, and 15 mole percent of t-butylacrylate units;

Resist 6: 75 mole % 4-hydroxystyrene units, 15 mole % styrene units, and 10 mole percent of t-butylacrylate units.

A Comparative Resist was also prepared that contained the same PAG and a resin binder that was a copolymer that contained 65 mole % 4-hydroxystyrene units, and 35 mole percent of t-butylacrylate units.

Coating layers of each of these Resists 1 through 6 and the Comparative Resist were coated to a dried layer thickness of about 8300 angstroms. Each of those dried coating layers were blanket exposed to deep UV radiation at an exposure energy of 64 mJ/cm² and then post-exposure baked via vacuum hotplate at 140° C. for 90 seconds. Resist layer thickness were again measured. Each of the coating layers of Resists 1 through 6 showed shrinkage of less than about 800 angstroms. Coating layers of Resists 4 and 6 showed well under 500 angstroms thickness loss. The coating layer of the Comparative Resist showed about 1400 angstroms of thickness loss (shrinkage) after the post-exposure bake.

The foregoing description of the invention is merely illustrative thereof, and it is understood that variations and modification can be made without departing from the spirit or scope of the invention as set forth in the following claims.

What is claimed is:

1. A method of forming a positive photoresist relief image, comprising:
   a) applying a layer of a positive photoresist composition on a substrate, the photoresist comprising a photoactive component and a resin binder comprising a polymer of the following formula:

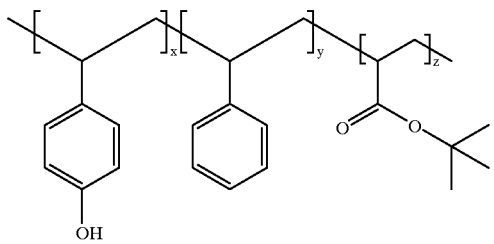

where x is about 65 to about 75 mole percent; y is about 10 to about 20 mole percent; and z is about 10 to about 20 mole percent;
   (b) exposing and developing the photoresist layer on the substrate to yield a relief image.

2. The method of claim 1 further comprising plating or etching substrates bared upon development.

3. The method of claim 1 wherein the substrate is a microelectronic wafer substrate.

4. The method of claim 1 wherein the substrate is a flat panel display substrate.

5. The method of claim 1 wherein the photoresist layer is exposed with radiation having a wavelength of about 300 nm or less.

6. The method of claim 1 wherein the photoresist layer is exposed with radiation having a wavelength of about 248 nm.

7. The method of claim 1 wherein the photoactive component comprises a photoacid generator that is an onium salt.

8. The method of claim 1 wherein the photoactive component comprises a photoacid generator that is a sulfonium compound.

9. The method of claim 1 wherein the sum of x, y and z is about 90 percent or greater.

10. The method of claim 1 wherein the sum of x, y and z is about 100 percent.

11. A method of forming a positive photoresist relief image, comprising:
    a) applying a layer of a positive photoresist composition on a substrate, the photoresist comprising a photoactive component and a resin binder comprising a polymer of the following formula:

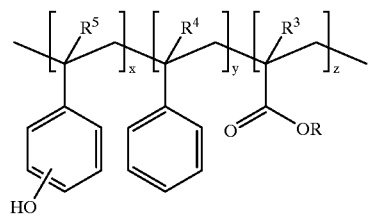

where R is branched alkyl having up to 10 carbon atoms; $R^3$, $R^4$ and $R^5$ are each hydrogen or methyl, x is about 65 to about 75 mole percent; y is about 10 to about 20 mole percent; and z is about 10 to about 20 mole percent;
    (b) exposing and developing the photoresist layer on the substrate to yield a relief image.

12. The method of claim 11 further comprising plating or etching substrates bared upon development.

13. The method of claim 11 wherein the substrate is a microelectronic wafer substrate.

14. The method of claim 11 wherein the substrate is a flat panel display substrate.

15. The method of claim 11 wherein the photoresist layer is exposed with radiation having a wavelength of about 300 nm or less.

16. The method of claim 11 wherein the photoresist layer is exposed with radiation having a wavelength of about 248 nm.

17. The method of claim 11 wherein the photoactive component comprises a photoacid generator that is an onium salt.

18. The method of claim 11 wherein the photoactive component comprises a sulfonium compound.

19. The method of claim 11 wherein the sum of x, y and z is about 90 percent or greater.

20. The method of claim 11 wherein the sum of x, y and z is about 100 percent.

* * * * *